United States Patent
Cao et al.

(10) Patent No.: US 10,079,354 B2
(45) Date of Patent: *Sep. 18, 2018

(54) VERTICALLY ALIGNED CARBON NANOTUBE TRAPEZOID FIN STRUCTURE

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US); Zhen Zhang, Sollentuna (SE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/479,468

(22) Filed: Apr. 5, 2017

(65) Prior Publication Data
US 2017/0207404 A1    Jul. 20, 2017

Related U.S. Application Data

(63) Continuation of application No. 14/744,132, filed on Jun. 19, 2015, now Pat. No. 9,653,695, which is a
(Continued)

(51) Int. Cl.
*H01L 27/28* (2006.01)
*H01L 51/05* (2006.01)
(Continued)

(52) U.S. Cl.
CPC .......... *H01L 51/0541* (2013.01); *B82Y 30/00* (2013.01); *H01L 27/283* (2013.01);
(Continued)

(58) Field of Classification Search
CPC . H01L 51/303; H01L 51/0541; H01L 51/105; H01L 51/0566; H01L 51/0525; H01L 51/055; H01L 51/0048
See application file for complete search history.

(56) References Cited

U.S. PATENT DOCUMENTS

| 8,772,782 B2* | 7/2014 | Cao .................. B82Y 10/00 |
| | | 257/192 |
| 9,502,673 B2 | 11/2016 | Cao et al. |
| 9,653,695 B2* | 5/2017 | Cao .................. H01L 27/283 |
| 9,786,851 B2* | 10/2017 | Cao .................. H01L 51/055 |
| 2003/0178617 A1* | 9/2003 | Appenzeller .......... B82Y 10/00 |
| | | 257/20 |

(Continued)

OTHER PUBLICATIONS

List of IBM Patents or Patent Applications Treated as Related; (Appendix P), Filed Apr. 7, 2017; 2 pages.

*Primary Examiner* — Evan Pert
(74) *Attorney, Agent, or Firm* — Cantor Colburn LLP; Vazken Alexanian

(57) ABSTRACT

A transistor device includes an array of fin structures arranged on a substrate, each of the fin structures being vertically alternating stacks of a first isoelectric point material having a first isoelectric point and a second isoelectric point material having a second isoelectric point that is different than the first isoelectric point; one or more carbon nanotubes (CNTs) suspended between the fin structures and contacting a side surface of the second isoelectric point material in the fin structures; a gate wrapped around the array of CNTs; and source and drain contacts arranged over the fin structures; wherein each of the fin structures have a trapezoid shape or parallel sides that are oriented about 90° with respect to the substrate.

20 Claims, 13 Drawing Sheets

Related U.S. Application Data continuation of application No. 14/674,339, filed on Mar. 31, 2015, now Pat. No. 9,502,673.

(51) Int. Cl.
*H01L 51/00* (2006.01)
*B82Y 30/00* (2011.01)
*H01L 51/10* (2006.01)
*B82Y 10/00* (2011.01)
*B82Y 40/00* (2011.01)

(52) U.S. Cl.
CPC ........ *H01L 51/0048* (2013.01); *H01L 51/055* (2013.01); *H01L 51/057* (2013.01); *H01L 51/0525* (2013.01); *H01L 51/0558* (2013.01); *H01L 51/0566* (2013.01); *H01L 51/105* (2013.01); *B82Y 10/00* (2013.01); *B82Y 40/00* (2013.01); *H01L 2251/303* (2013.01); *Y10S 977/742* (2013.01); *Y10S 977/842* (2013.01); *Y10S 977/938* (2013.01)

(56) References Cited

U.S. PATENT DOCUMENTS

| | | | |
|---|---|---|---|
| 2006/0115640 A1* | 6/2006 | Yodh | B82Y 10/00 428/221 |
| 2011/0136304 A1* | 6/2011 | Wong | B82Y 10/00 438/167 |
| 2011/0147715 A1* | 6/2011 | Rogers | B82Y 10/00 257/24 |
| 2011/0309332 A1* | 12/2011 | Chang | B82Y 10/00 257/24 |
| 2013/0126830 A1* | 5/2013 | Cao | B82Y 10/00 257/24 |
| 2013/0270652 A1* | 10/2013 | Liaw | H01L 27/1104 257/401 |
| 2014/0364574 A1* | 12/2014 | Afzali-Ardakani | C08G 75/06 525/327.2 |
| 2016/0293668 A1* | 10/2016 | Cao | H01L 27/283 |
| 2017/0025614 A1 | 1/2017 | Cao et al. | |
| 2017/0207404 A1* | 7/2017 | Cao | H01L 27/283 |

* cited by examiner

VERTICALLY ALIGNED CARBON NANOTUBE TRAPEZOID FIN STRUCTURE

This application is a continuation of and claims priority from U.S. patent application Ser. No. 14/744,132, filed on Jun. 19, 2015, entitled "TRANSISTOR DEVICE WITH VERTICAL CARBON NANOTUBE (CNT) ARRAYS OR NON-VERTICAL TAPERED CNT ARRAYS," which is a continuation of and claims priority from U.S. patent application Ser. No. 14/674,339, filed on Mar. 31, 2015, entitled "TRANSISTOR DEVICE WITH TAPERED SUSPENDED VERTICAL ARRAYS OF CARBON NANOTUBES," each application is incorporated herein by reference in its entirety.

BACKGROUND

The present disclosure generally relates to field effect transistors (FET), and particularly to carbon nanotube field effect transistors (CNTFETs).

In FETs, current flows along a semiconductor path called the channel. Source and drain electrodes are arranged at opposing ends of the channel. The physical diameter of the channel is fixed, but its effective electrical diameter is varied by applying a voltage to a control electrode called the gate. The FET's conductivity depends, at any given instant in time, on the channel's electrical diameter. A small change in gate voltage can cause large variations in the current from the source to the drain, which amplifies signals. FETs are constructed from various semiconductors, such as bulk silicon, and use a single crystal semiconductor wafer as the channel.

CNTFETs use a single CNT or an array of CNTs as the channel material. The achievable current must be comparable to silicon technology. Although semiconducting CNTs can conduct exceptionally high currents for their nanoscale diameter, their small size limits the current they can carry.

SUMMARY

In one embodiment of the present disclosure, transistor devices include fin structures arranged on a substrate, each of the fin structures being vertically alternating stacks of a first isoelectric point material having a first isoelectric point and a second isoelectric point material having a second isoelectric point that is different than the first isoelectric point; one or more carbon nanotubes (CNTs) suspended between the fin structures and contacting a side surface of the second isoelectric point material in the fin structures; a gate wrapped around the array of CNTs; and source and drain contacts arranged over the fin structures; wherein each of the fin structures have a trapezoid shape or parallel sides that are oriented about 90° with respect to the substrate.

In another embodiment, a method of making a transistor device includes forming an array of fin structures, the array of fin structures being arranged on a substrate and each having a pair of layers, the pair of layers comprising a first isoelectric point material having a first isoelectric point and a second isoelectric point material having a second isoelectric point that is different than the first isoelectric point; wrapping a gate around carbon nanotubes (CNTs) between the fin structures to suspend the CNTs in the gate, the CNTs contacting a side surface of the second isoelectric point material in the fin structures; and forming source and drain contacts over the fin structures; wherein the CNTs are arranged in a substantially vertical array or a non-vertical tapered array within the gate.

Yet, in another embodiment, a method of making a transistor device includes forming a fin structure, the fin structure comprising at least one pair of layers, each pair of layers comprising a first isoelectric point material having a first isoelectric point and a second isoelectric point material having a second isoelectric point that is different than the first isoelectric point; selectively contacting a carbon nanotube (CNT) to a side surface of the second isoelectric point material in the fin structure; forming source and drain contacts on opposing ends of the fin structure; removing portions of the fin structure between the source and drain contacts so as to suspend the CNT; and forming a gate wrapped around the CNT.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
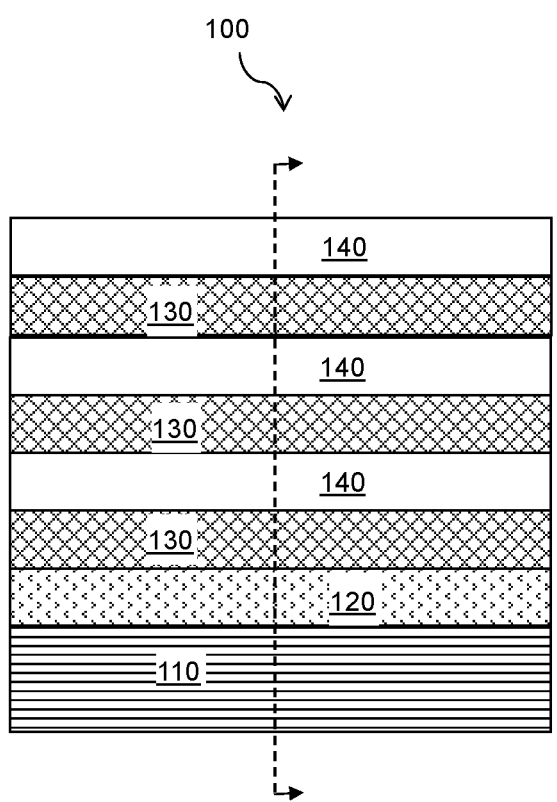
FIG. 1 illustrates a side view of a transistor with stacked layers including two isoelectric point materials according to an exemplary embodiment.

The present disclosure relates to CNTFETs, which are now described in detail with accompanying figures. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the term "fin structure" is a structure that protrudes above a top surface of a substrate and has a length, a height, and either substantially parallel sides or sides with two different widths.

As used herein, the term "trapezoid shape" means a structure having a length, a height, and two different widths.

As used herein, the term "isoelectric point" is the pH at which a particular molecule or surface carries no net electrical charge.

The CNTFETs described herein, including fin structures and CNTs suspended in a gate structure, provide optimal CNT pitch control and device electrostatics. The CNT self-alignment process also minimizes parasitics.

Referring to FIG. 1, a transistor 100 includes stacked layers with isoelectric point materials. Transistor 100 includes a substrate 110, a dielectric material layer 120 formed on a top surface of the substrate 110, and at least one vertically alternating stack of a first isoelectric point material layer 130 and a second isoelectric point material layer 140, the properties of which are described in further detail hereinafter. Each vertically alternating stack includes, from bottom to top, a pair of layers including a first isoelectric point material layer 130 and a second isoelectric point material layer 140. In one embodiment, the at least one pair of layers is formed as a plurality of pairs of layers that constitute an alternating stack of the first isoelectric point material layer 130 and the second isoelectric point material layer 140. The transistor can include any number of pairs of stacked layers as long as it includes at least one pair. Although transistor 100 includes the first dielectric point material layer 130 disposed directly on the dielectric material layer 120, the second isoelectric point material layer 140 can be disposed directly on the dielectric material layer 120 in another exemplary embodiment.

The substrate 110 includes a dielectric material, a semiconductor material, a conductive material, or any combination thereof. In one exemplary embodiment, the substrate includes silicon. The thickness of the substrate 110 is selected so that the substrate 110 provides mechanical support for the dielectric material layer 120 and the at least one vertically alternating stack of first and second isoelectric point material layers 130 and 140. For example, the thickness of the substrate 110 can be from about 50 microns to about 2 millimeters (mm), although lesser and greater thicknesses can also be employed.

The dielectric material layer 120 includes a dielectric material. Non-limiting examples of suitable dielectric materials include silicon nitride, silicon oxide, a dielectric metal oxide, or any combination thereof. The thickness of the dielectric material layer 120 can be from about 1 nanometer (nm) to about 1 micron, although lesser and greater thicknesses can also be employed. If the substrate 110 includes a dielectric material at a top portion thereof, the dielectric material layer 120 is optional.

Each first isoelectric point material layer 130 includes a first isoelectric point material having a first isoelectric point. Each second isoelectric point material layer 140 includes a second isoelectric point material having a second isoelectric point that is different from the first isoelectric point. The first isoelectric point is the pH at which surfaces of the first isoelectric point material layer 130 carries no net electrical charge, and the second isoelectric point is the pH at which surfaces of the second electric point material layer 140 carries no net electrical charge.

The first isoelectric point material and the second isoelectric point material are selected so that the first isoelectric point is different from the second isoelectric point. In one embodiment, the first isoelectric point is greater than the second isoelectric point. In another embodiment, the second isoelectric point is greater than the first isoelectric point by at least 2.0 units. Yet in another embodiment, the second isoelectric point is greater than the first isoelectric point by at least 4.0 units.

A non-limiting example of the first isoelectric point material includes silicon oxide. Silicon oxide has an isoelectric point of about 2.0. Non-limiting examples of the second isoelectric point material include silicon nitride, dielectric metal oxides, or a combination thereof. Dielectric metal oxides, e.g., hafnium oxide, have an isoelectric point about 8.0. Silicon nitride has an isoelectric point about 6.5.

The thickness of each first isoelectric point material layer 130 is greater than 0.5 nm. In one embodiment, the thickness of each first isoelectric point material layer 130 can be, for example, from about 1.5 nm to about 300 nm, although lesser and greater thicknesses can also be employed.

If a plurality of first isoelectric point material layers 130 is present, the thickness of each first isoelectric point material layer 130 can be the same as, or different from, the thicknesses of other first isoelectric point material layers 130. Likewise, if a plurality of second isoelectric point material layers 140 is present, the thickness of each second isoelectric point material layer 140 can be the same as, or different from, the thicknesses of other second isoelectric point material layers 140. The thickness of any of the first and second isoelectric point material layers 130 and 140 can be the same or different.

Each second isoelectric point material layer 140 has a thickness that is greater than a minimum diameter of a semiconducting CNT. In one embodiment, each second isoelectric point material layer 140 has a thickness that is at least 1 to 100 times a diameter of a semiconducting CNT. In another embodiment, each second isoelectric point material layer 140 has a thickness about or in any range from about 1.5, 10, 50, 100, 150, 200, 250, and 300 nm.

Each first and second isoelectric point material layers 130 and 140 can be deposited using a suitable deposition process such as, for example, by chemical vapor deposition (CVD), atomic layer deposition (ALD), spin coating, physical vapor deposition (PVD), or any combination thereof.

Each vertically adjacent pair of a first and second isoelectric point material layers 130 and 140 form a bilayer stack that includes a pair of layers, e.g., a first isoelectric point material layer 130 and a second isoelectric point material layer 140. The number of vertically alternating stacks, e.g., the number of bilayer stacks, can be from about 1 to about 1,000, although a greater number can also be employed.

Figure 2A:
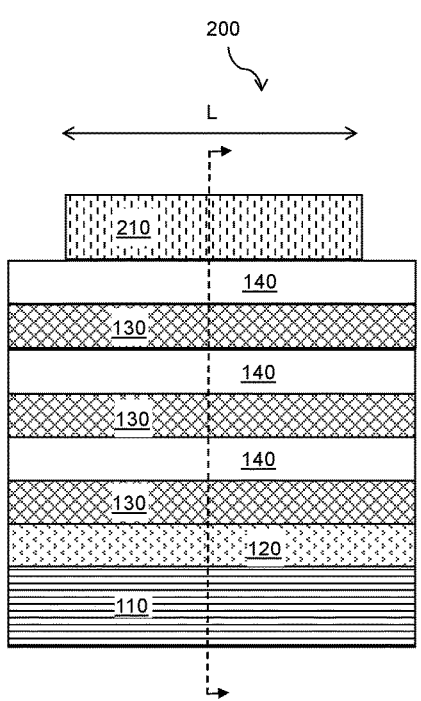
FIG. 2A illustrates a side view of a patterned photoresist on top of transistor of FIG. 1A according to an exemplary embodiment.
Figure 2B:
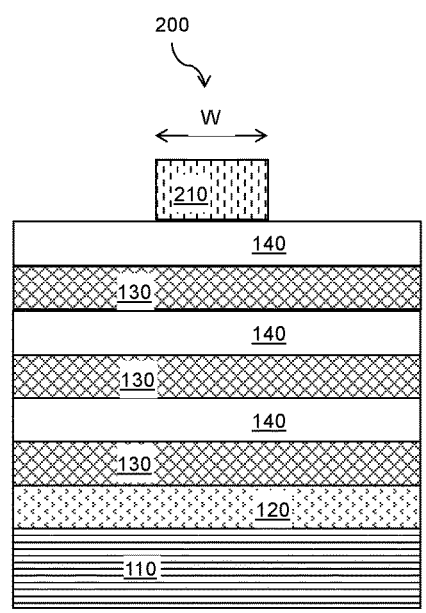
FIG. 2B illustrates a cross-sectional side view along with dotted axis of FIG. 2A.

Referring to FIGS. 2A-2B, transistor 200 includes a patterned photoresist on a top surface of the vertically alternating stack of the transistor of FIG. 1. A photoresist 210 is applied to the topmost layer of the vertically alternating stack (either the first or the second isoelectric point material layers 130 or 140). The photoresist is then lithographically patterned by exposure and development. The photoresist is lithographically patterned to define a photoresist pattern having a length (L) and a width (W). The length L is greater than or equal to the width W.

Figure 3A:
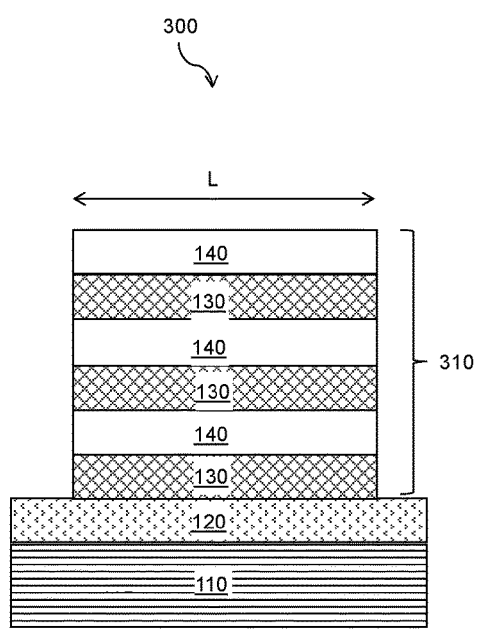
FIG. 3A illustrates a side view of the transistor of FIG. 2A after etch masking the stacked layers according to an exemplary embodiment.
Figure 3B:
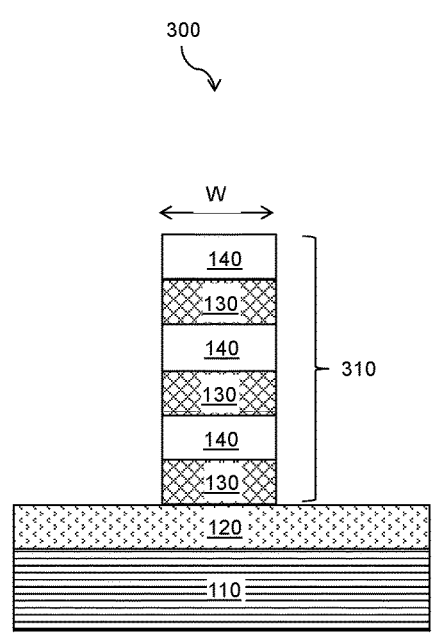
FIG. 3B illustrates a cross-sectional side view along the dotted axis of FIG. 3A.
Figure 4A:
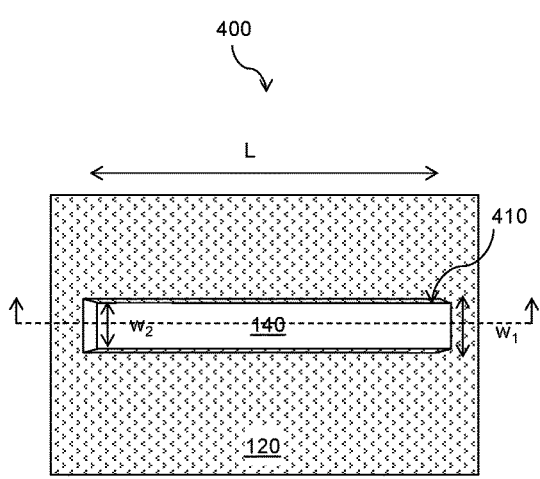
FIG. 4A illustrates a top view of the transistor of FIG. 3A after reactive ion etching (ME) to form a trapezoid-shaped fin according to an exemplary embodiment.
Figure 4B:
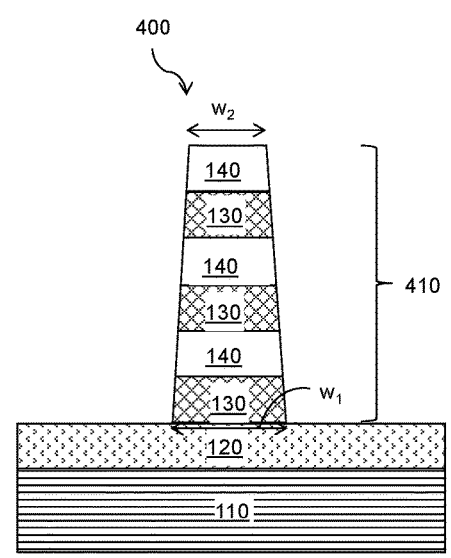
FIG. 4B illustrates a cross-sectional side view along the dotted axis of FIG. 4A.

FIGS. 3A, 3B, 4A, and 4B show various embodiments of fin structures. FIGS. 3A-3B show a transistor 300 having a fin structure with a vertical stack having substantially parallel sides that are oriented about 90° with respect to the substrate 110. FIGS. 4A-4B show a transistor 400 having a fin structure with a trapezoid shape. Any of the below processes shown in FIG. 5A-5C, 6A-6B, 7A-7B, 8A-8B, 9A-9B, 10A-10B, 11A-11B, or 12A-12B can be applied to the transistor 300 or transistor 400. Although FIGS. 3A, 3B, 4A, and 4B show a single fin structure arranged on a substrate for simplicity, any number of fin structures can be arranged on the substrate as an array of fin structures. For example, hundreds, thousands, or millions of fin structures may be arranged as an array on the substrate.

Referring to FIGS. 3A-3B, transistor 300 shows the transistor of FIGS. 2A-B after etch masking the stacked layers according to one embodiment. The photoresist pattern is transferred to the vertically alternating stack of the first and second isoelectric point material layers 130 and 140 by an anisotropic etch that employs the patterned photoresist as an etch mask. The patterned stack is a fin structure that protrudes above a top surface of the substrate 110 and has a first pair of substantially parallel sidewalls along a lengthwise direction and a second pair of sidewalls along a widthwise direction. The sidewalls along the lengthwise direction are oriented about 90° with respect to the substrate 110. For example, each fin structure can have a length L along the lengthwise direction, which is a first horizontal direction that is substantially perpendicular to the surface normal of the top surface of the dielectric material layer 120. Each fin structure has a width W along the widthwise direction, which is a second horizontal direction that is substantially perpendicular to the surface normal of the top surface of the dielectric material layer 120 and perpendicular to the lengthwise direction. The length L is greater than the width W.

The patterned photoresist is removed, for example, by ashing. In one embodiment, the width W is from about 5 nm to about 50 microns, and the length L is from about 5 nm to about 50 microns, although lesser and greater widths W, lesser and greater lengths L, and lesser and greater heights can also be employed.

Although fin structure 310 has lengthwise sidewalls that are oriented about 90° with respect to the substrate 110, the lengthwise sidewalls can be oriented at angles that are less than 90° with respect to the substrate 110 (not shown). For example, the fin structure 310 can have lengthwise sidewalls that are oriented from about 45 to about 90° with respect to the substrate 110. In other embodiments, the fin structure 310 can have lengthwise sidewalls that are oriented in any range from about 45, 55, 60, 65, 70, 75, 80, 85, or 90° with respect to the substrate 110.

Referring to FIGS. 4A-4B, transistor 400 includes a trapezoid-shaped fin 410 according to another embodiment. The trapezoid-shaped fin 410 can be formed after etching the fin structure of FIGS. 3A-3B using a suitable etching process such as, for example, reactive ion etching (RIE). RIE is a dry etching method that uses chemically reactive plasma to remove material deposited on wafers. The plasma is generated under low pressure (vacuum pressure) by an electromagnetic field. High-energy ions from the plasma attack and react with the fin structure surface. RIE is used to form a tapered fin structure having a length L and first and second widths $w_1$ and $w_2$. The first width $w_1$ corresponds to the bottom surface 410 of the vertical stack disposed on the substrate 110. The second width $w_2$ corresponds to the top surface 420 of the vertical stack. The first width $w_1$ is greater than the second with $w_2$. The trapezoid shaped fin 410 may be favorable to avoid shadow effects in during subsequent process steps (e.g., RIE and deposition).

Figure 5A:
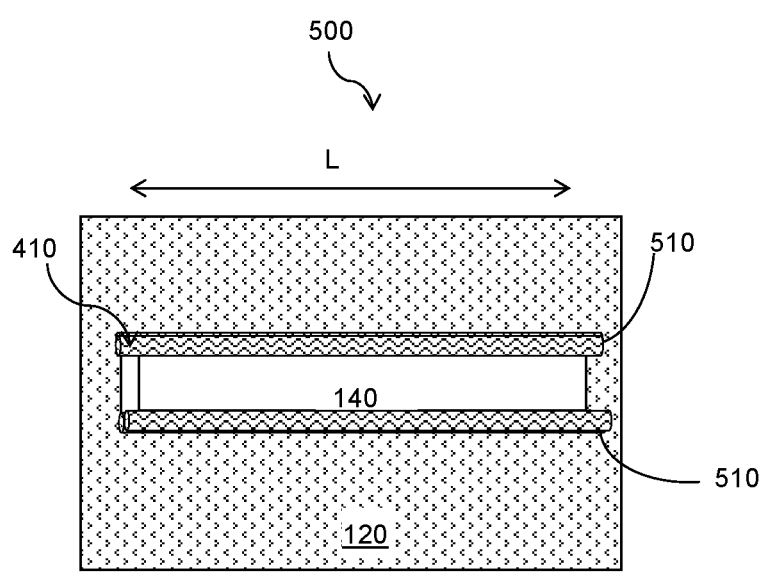
FIG. 5A illustrates a top view of the transistor of FIG. 4A after selective CNT placement on the trapezoid-shaped fin according to an exemplary embodiment.
Figure 5B:
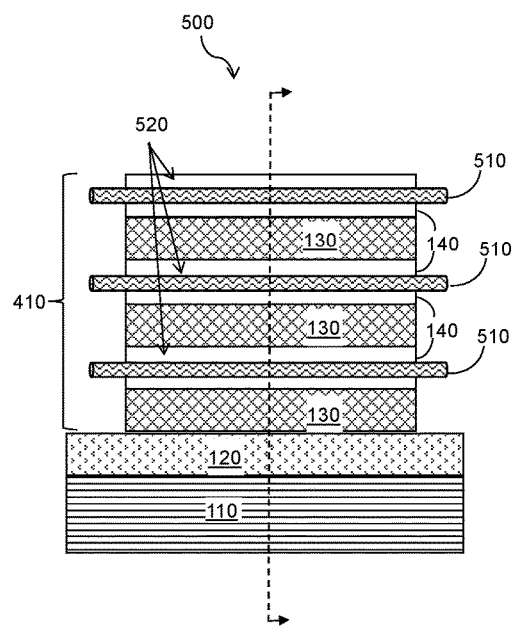
FIG. 5B illustrates a side view of the transistor of FIG. 5A.
Figure 5C:
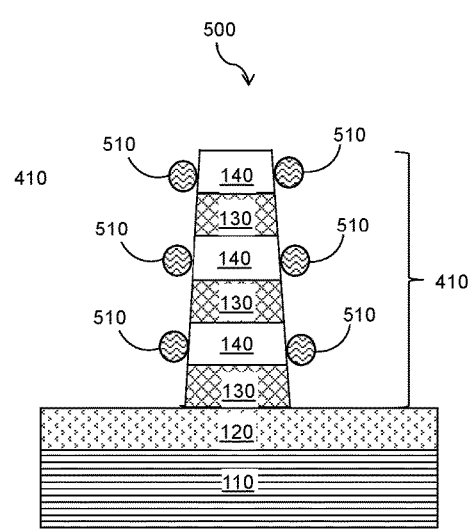
FIG. 5C illustrates a cross-sectional side view along the dotted axis of FIG. 5B.

Referring to FIGS. 5A-5C, transistor 500 includes CNTs contacting the trapezoid-shaped fin 410 protruding from the dielectric material 120. The CNTs 510 selectively contact the lengthwise side 520 of the second isoelectric point material layer 140 in the trapezoid-shaped fin 410 structure. The CNTs 510 contact or interact with the second isoelectric point material layer 140 by an electrostatic interaction, or a charge to charge interaction. In another embodiment, CNTs 510 are similarly bound to the fin structure 310 (not shown).

Optionally, a surface monolayer (not shown) is selectively formed on the surface of the second isoelectric point material layer 140 (discussed below). The surface monolayer provides an electrostatic charge that binds to the solubilized and charged CNTs 510 (discussed below).

To bind or contact the CNTs 510 to the second isoelectric point material layer 140, the CNTs 510 and the second isoelectric point material layer 140 are oppositely charged. The second isoelectric point material layer 140 can be charged by forming a charged monolayer on a surface of the lengthwise side 520 or adjusting the pH. The CNTs are charged by solubilizing in an ionic surfactant.

To bind or contact the CNTs 510, the substrate 110, optional dielectric material layer 120, and trapezoid-shaped fin 410 are immersed in a CNT bath. The CNT bath includes CNTs 510 in an aqueous solution. The aqueous solution can be deionized water having a pH of 7.0. Optionally, the pH is adjusted by adding an acid or a base to alter the pH a value between the first and second isoelectric points. An ionic surfactant is added to the CNT bath. The ionic surfactant can be anionic surfactant that attaches to the CNTs 510 and imparts negative charges to the CNTs 510. The ionic surfactant also can be a cationic surfactant that attaches to the CNTs 510 and imparts positive charges to the CNTs 510.

In one embodiment, the second isoelectric point is greater than the first isoelectric point, and the ionic surfactant is an anionic surfactant. An exemplary anionic surfactant is sodium dodecyl sulfate (SDS). For example, each second isoelectric point material layer 140 includes a material selected from silicon nitride and a dielectric metal oxide, and each first isoelectric point material layer 130 includes silicon oxide. In this case, surfaces of each second isoelectric point material layer 130 in contact with the CNT 510 including solution becomes positively charged because the second isoelectric point is greater than the pH of the CNT solution. Surfaces of each first isoelectric point material layer 130 in contact with the CNT solution become negatively charged because the first isoelectric point is less than the pH of the CNT solution. The free-floating CNTs 510 become negatively charged by the anionic surfactants. The free-floating CNTs 510 become electrostatically attracted to, and become attached to, the second isoelectric point material layer 140 by electrostatic force. The free-floating CNTs 510 are electrostatically repelled from the first isoelectric point material layer 130 by electrostatic force. The CNTs 510, as attached to the surfaces of the second isoelectric point material layer 140, are self-aligned to a lengthwise direction along the lengthwise surfaces of the second isoelectric point material layer 140.

In one exemplary embodiment, the first isoelectric point material layer 130 is silicon oxide, the second isoelectric point material layer 140 is silicon nitride, and a 4-(N-hydroxycarboxamido)-1-methylpyridinium iodide (NMPI) monolayer is selectively formed on the silicon nitride's surface. The NMPI monolayer includes a hydroxamic acid end group that self-assembles on metal oxide surfaces, but not on silicon oxide. The NMPI monolayer is assembled by placing the substrate in a NMPI solution of NMPI. The functionalized surface is then placed in an aqueous CNT solution. The CNTs 510 are solubilized by using an anionic surfactant (e.g., sodium dodecyl sulphate (SDS)). The NMPI anion (iodide) is exchanged with the anionic surfactant surrounding the CNTs 510, which leads to a columbic/electrostatic attraction between the negatively charged surfactant and the positively charged monolayer. The CNTs 510 are specifically bound to the exposed silicon nitride surface. The NMPI's iodide and the surfactant's sodium ion are removed as sodium iodide, which dissolves into the solution.

Figure 6A:
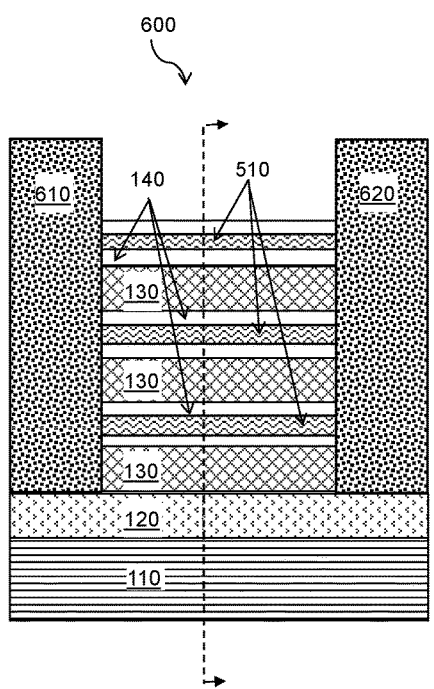
FIG. 6A illustrates a side view of the transistor of FIG. 5A after forming source and drain contacts according to an exemplary embodiment.
Figure 6B:
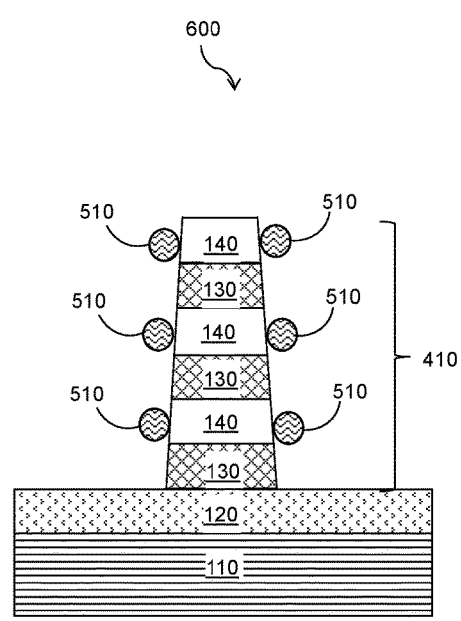
FIG. 6B illustrates a cross-sectional side view along the dotted axis of FIG. 6A.

Referring to FIGS. 6A-6B, a source contact 610 and a drain contact 620 are formed directly on the CNTs 510 attached to the second isoelectric point material layer 140 at the lateral edges sides of the substrate 110 in the transistor 600. The source and drain contacts 610 and 620 include one or more metals. The source contact structure 610 is in contact with one end of each CNT 510, and the drain contact structure 620 is in contact with the other end of each CNT 510. The CNTs 510 are anchored in the source and drain contacts 610 and 620. The end portions of the CNTs 510 that are in contact with the source contact 610 collectively function as a source of a FET. The end portions of the CNTs 510 that are in contact with the drain contact 620 collectively function as a drain of the FET.

The source and drain contacts 610 and 620 can be formed by a lift-off process. In the lift-off process, a photoresist is used create an inverse pattern. Then metal is deposited onto exposed surface regions, which will form the source drain contacts 610 and 620. When the photoresist is washed, the unwanted metal on top of the photoresist is lifted-off and washed away with the photoresist.

Figure 7A:
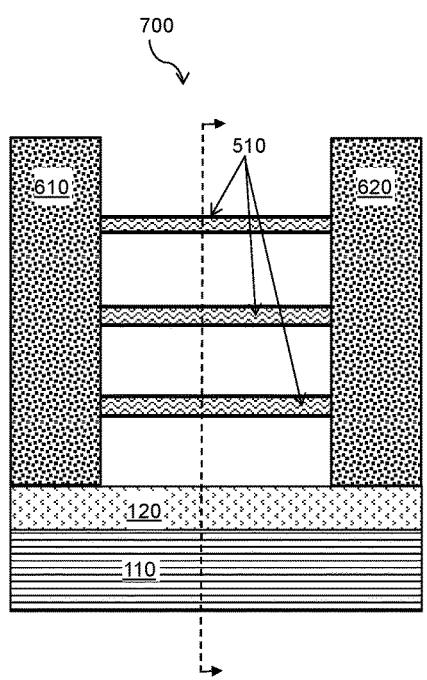
FIG. 7A illustrates a side view of the transistor of FIG. 6A after wet etching to suspend the CNTs in the gate region according to an exemplary embodiment.
Figure 7B:
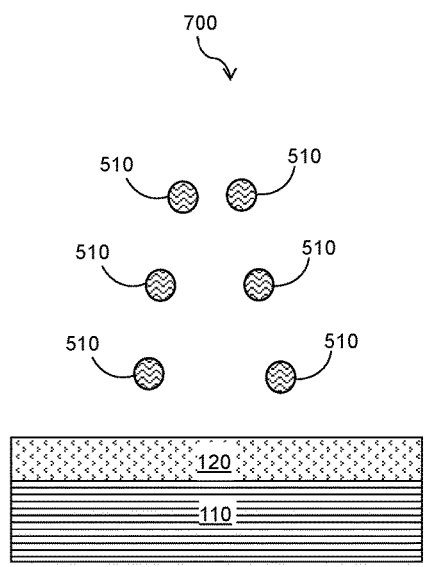
FIG. 7B illustrates a cross-sectional side view along the dotted axis of FIG. 7A.

Referring to FIGS. 7A-7B, the trapezoid-shaped fin structure 410 is wet-etched to suspend the CNTs 510 in the central gate region and anchor the CNTs 510 in the source and drain contacts 610 and 620 of the transistor 700. The CNTs 510 are stacked in a tapered orientation with respect to an axis perpendicular to the substrate 110. The CNTs 510 are oriented substantially parallel to the substrate 110. The CNTs 510 are suspended as an array of CNTs 510 between the fin structures arranged within the source and drain contacts 610 and 620.

Figure 8A:
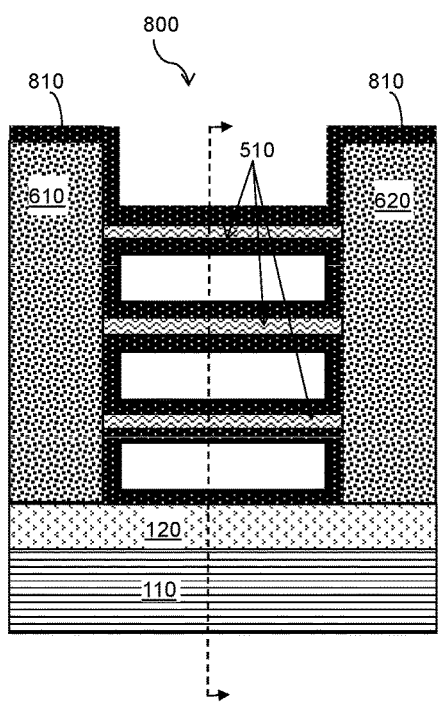
FIG. 8A illustrates a side view of the transistor of FIG. 7A after depositing a sacrificial gate dielectric according to an exemplary embodiment.
Figure 8B:
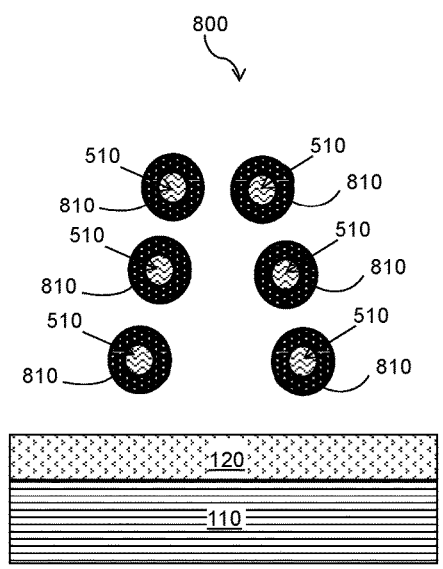
FIG. 8B illustrates a cross-sectional side view along the dotted axis of FIG. 8A.

Referring to FIGS. 8A-8B, a sacrificial gate dielectric 810 is deposited and patterned on the transistor 800. The sacrificial gate dielectric 810 surrounds the suspended CNTs 510 in the central gate region of the substrate 110 between the fin structures. The sacrificial gate dielectric 810 can include a silicon oxide-based dielectric material or a high-k dielectric material (e.g., a dielectric metal oxide). The sacrificial gate dielectric 810 can be deposited by atomic layer deposition (ALD). In one embodiment, the gate dielectric material layer 810 includes hafnium oxide, aluminum oxide, or any combination thereof. In another embodiment, the gate dielectric material layer 810 includes an oxide material, for example a metal oxide material.

Figure 9A:
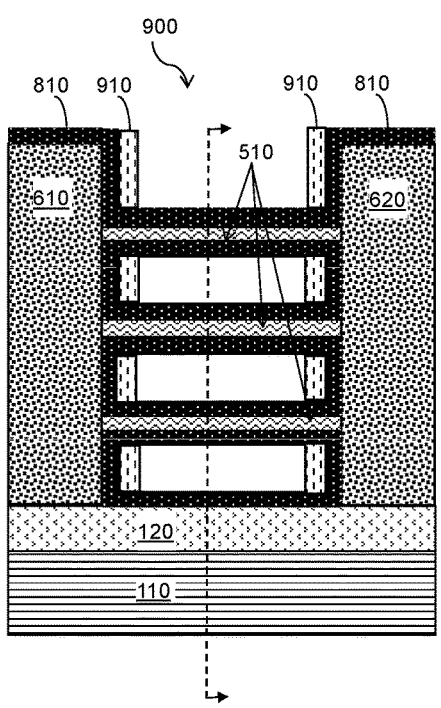
FIG. 9A illustrates a side view of the transistor of FIG. 8A after forming a gate spacer according to an exemplary embodiment.
Figure 9B:
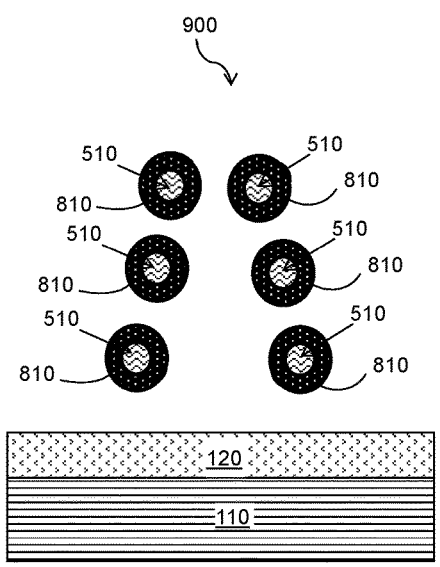
FIG. 9B illustrates a cross-sectional side view along the dotted axis of FIG. 9A.

Referring to FIGS. 9A-9B, a dielectric gate spacer 910 is formed by depositing a gate spacer dielectric material layer and a subsequent anisotropic etch, for example by RIE, of the gate spacer dielectric material layer in the transistor 900. The gate spacer dielectric material layer includes a dielectric material. The dielectric material can be silicon nitride, silicon oxide, a dielectric metal oxide, or any combination thereof. The anisotropic etch removes horizontal portions of the gate spacer dielectric material layer. The remaining vertical portions of the gate spacer dielectric material layer form the dielectric gate spacer 910 that laterally surrounds the stack of the sacrificial gate dielectric 810. The thickness of the gate spacer 910 can be from about 1 nm to about 100 nm, although lesser and greater thicknesses can also be employed.

Figure 10A:
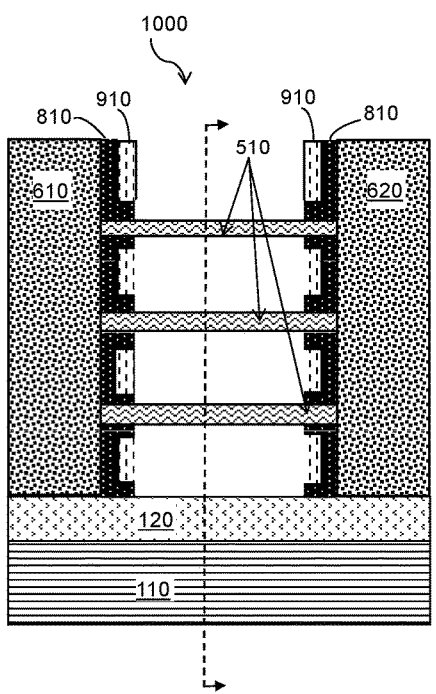
FIG. 10A illustrates a side view of the transistor of FIG. 9A after removing the sacrificial gate dielectric according to an exemplary embodiment.
Figure 10B:
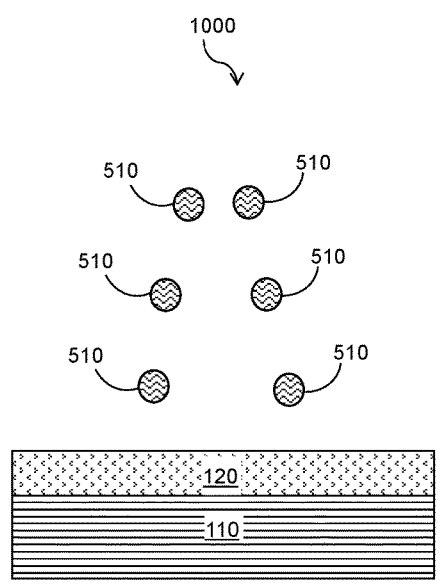
FIG. 10B illustrates a cross-sectional side view along the dotted axis of FIG. 10A.

Referring to FIGS. 10A and 10B, the horizontal portions of the sacrificial gate dielectric 810 are removed from the transistor 1000. For example, the sacrificial gate dielectric 810 is removed by a hydrogen fluoride dip. The CNTs 510 are then freely suspended in the central gate region of the substrate 110.

Figure 11A:
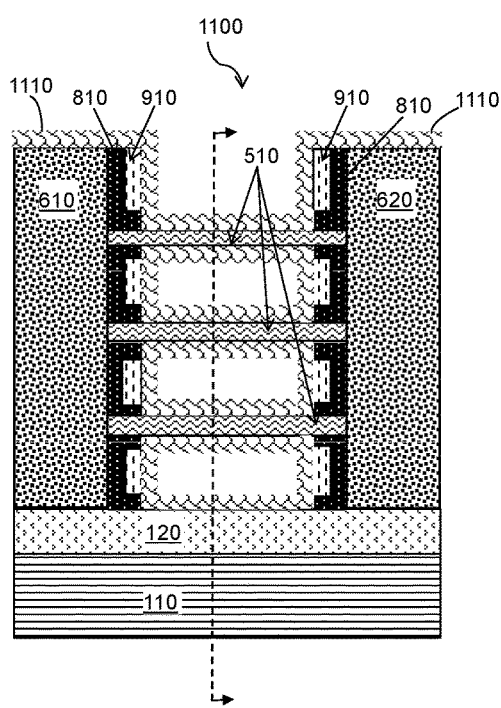
FIG. 11A illustrates a side view of the transistor of FIG. 10A after depositing a gate dielectric next to the gate spacer according to an exemplary embodiment.
Figure 11B:
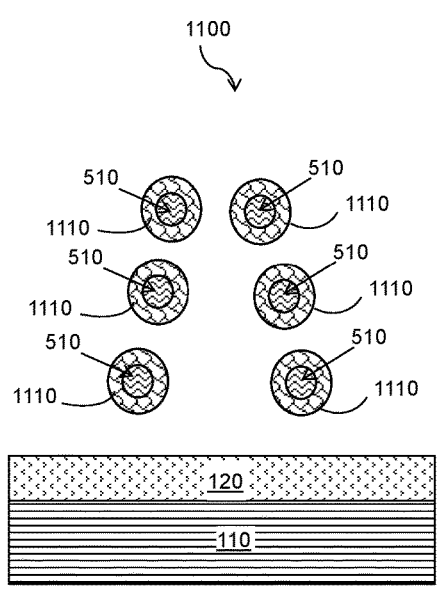
FIG. 11B illustrates a cross-sectional side view along the dotted axis of FIG. 11A.

Referring to FIGS. 11A and 11B, a gate dielectric 1110 is deposited and patterned in the central gate region and on the top surface of the source and drain contacts 610 and 620 of the transistor 900. The suspended CNTs 510 are surrounded by the gate dielectric 1110. The gate dielectric 1110 can include a silicon oxide-based dielectric material or a high-k dielectric material (e.g., a dielectric metal oxide). The gate dielectric 1110 can be deposited by ALD. In one embodiment, the gate dielectric material layer 1110 includes hafnium oxide, aluminum oxide, or a combination thereof.

Figure 12A:
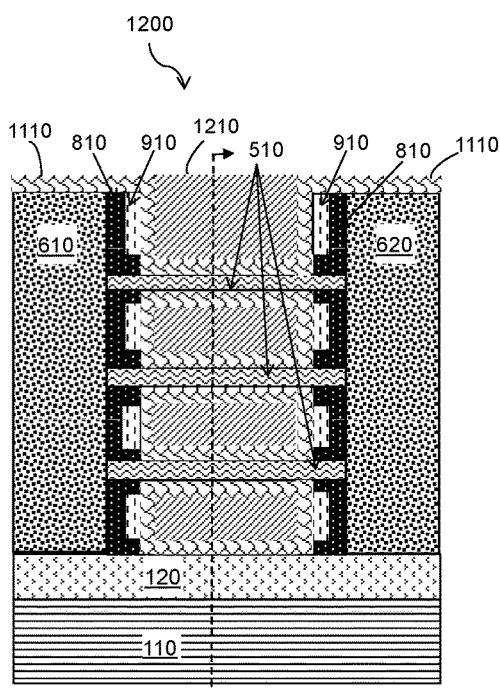
FIG. 12A illustrates a side view of the transistor of FIG. 11A after depositing a metal gate according to an exemplary embodiment.
Figure 12B:
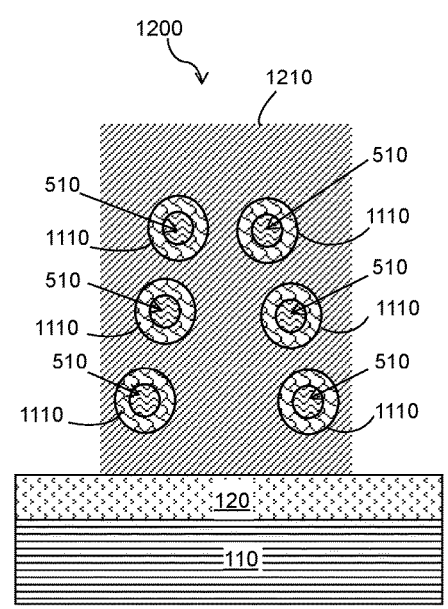
FIG. 12B illustrates a cross-sectional side view along the dotted axis of FIG. 12A

Referring to FIGS. 12A and 12B, a metal gate material 1210 is deposited on the central gate region adjacent to the gate spacer 910 in the transistor 1200. The metal gate material 1210, gate spacer 910, and gate dielectric 1110 form the gate electrode. The gate electrode is wrapped around the CNTs 510. The gate electrode includes CNTs 510 suspended in a tapered, non-vertical stacked orientation. The metal gate material 1210 is separated from the source and drain contacts 610 and 620 by the gate spacer 910 and the gate dielectric 1110.

In another embodiment, any of the above processes and methods shown in FIG. 5A-5C, 6A-6B, 7A-7B, 8A-8B, 9A-9B, 10A-10B, 11A-11B, or 12A-12B can be applied to the fin structure 310 to suspend the CNTs 510 in the central gate region and anchor CNTs 510 in source and drain contacts 610 and 620 of a transistor (not shown). The resulting transistor will include a suspended array of CNTs in a stacked substantially vertical orientation, compared to a tapered array.

While the disclosure has been described in terms of specific embodiments, it is evident in view of the foregoing description that numerous alternatives, modifications and variations will be apparent to those skilled in the art. The various embodiments of the present disclosure can be implemented solely, or in combination with any other embodiments described herein unless incompatibility among various embodiments are expressly stated or otherwise clear to one of ordinary skill in the art. Accordingly, the disclosure is intended to encompass all such alternatives, modifications and variations which fall within the scope and spirit of the disclosure and the following claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a transistor device, the method comprising:
    forming an array of fin structures, the array of fin structures being arranged on a substrate and each having a pair of layers, the pair of layers comprising a first isoelectric point material having a first isoelectric point and a second isoelectric point material having a second isoelectric point that is different than the first isoelectric point;
    wrapping a gate around carbon nanotubes (CNTs) between the fin structures to suspend the CNTs in the gate, the CNTs contacting a side surface of the second isoelectric point material in the fin structures; and
    forming source and drain contacts over the fin structures;
    wherein the CNTs are arranged in a non-vertical tapered array within the gate.

2. The method of claim 1, wherein a gate dielectric material surrounds the CNTs and is hafnium oxide.

3. The method of claim 1, wherein a gate dielectric material surrounds the CNTs and is aluminum oxide.

4. The method of claim 1, wherein the CNTs are anchored in the source and drain contacts.

5. The method of claim 1, wherein the gate comprises a metal gate material separated from the source and drain contacts by a gate spacer.

6. The method of claim 1, wherein the gate comprises a metal gate material separated from the source and drain contacts by a gate dielectric material.

7. The method of claim 1, wherein each of the fin structures have a width that is less than a length of the fin structure.

8. The method of claim 1, wherein the CNTs contact the second isoelectric point material by an electrostatic interaction.

9. The method of claim 1, further comprising a positively charged surface monolayer selectively assembled on the second dielectric point material.

10. The method of claim 1, wherein the CNTs are substantially parallel to the substrate.

11. A method of making a transistor device, the method comprising:
    forming a fin structure, the fin structure comprising at least one pair of layers, each pair of layers comprising a first isoelectric point material having a first isoelectric point and a second isoelectric point material having a second isoelectric point that is different than the first isoelectric point;

selectively contacting carbon nanotubes (CNTs) to a side surface of the second isoelectric point material in the fin structure;

forming source and drain contacts on opposing ends of the fin structure;

removing portions of the fin structure between the source and drain contacts so as to suspend the CNTs in a non-vertical tapered array; and forming a gate wrapped around the CNTs.

12. The method of claim 11, wherein the fin structure has a trapezoid shape.

13. The method of claim 11, further comprising solubilizing the CNTs with a surfactant before selectively contacting the CNTs to the second isoelectric point material.

14. The method of claim 13, wherein the surfactant is negatively charged.

15. The method of claim 11, wherein the CNTs are substantially parallel to the substrate.

16. The method of claim 11, wherein a gate dielectric material surrounds the CNTs and is hafnium oxide.

17. The method of claim 11, wherein a gate dielectric material surrounds the CNTs and is aluminum oxide.

18. The method of claim 11, wherein the CNTs are anchored in the source and drain contacts.

19. The method of claim 11, wherein the gate comprises a metal gate material separated from the source and drain contacts by a gate spacer.

20. The method of claim 11, wherein the gate comprises a metal gate material separated from the source and drain contacts by a gate dielectric material.

* * * * *